United States Patent
Hawken et al.

(10) Patent No.: US 9,297,321 B2
(45) Date of Patent: Mar. 29, 2016

(54) FLEXIBLE CRANK ANGLE POSITION SENSING

(75) Inventors: Wayne Hawken, Bibra Lake (AU); Doyle Kent Stewart, Laporte, CO (US)

(73) Assignee: Woodward, Inc., Fort Collins, CO (US)

( * ) Notice: Subject to any disclaimer, the term of this patent is extended or adjusted under 35 U.S.C. 154(b) by 1111 days.

(21) Appl. No.: 13/324,008

(22) Filed: Dec. 13, 2011

(65) Prior Publication Data

US 2013/0151194 A1    Jun. 13, 2013

(51) Int. Cl.
| | |
|---|---|
| *G01D 5/245* | (2006.01) |
| *F02D 41/00* | (2006.01) |
| *F02D 41/22* | (2006.01) |
| *F02D 41/24* | (2006.01) |
| *H03M 1/30* | (2006.01) |

(52) U.S. Cl.
CPC ............ *F02D 41/009* (2013.01); *F02D 41/222* (2013.01); *F02D 41/2425* (2013.01); *G01D 5/2455* (2013.01); *F02D 41/2422* (2013.01); *H03M 1/308* (2013.01); *Y02T 10/40* (2013.01)

(58) Field of Classification Search
CPC . F02D 41/009; F02D 41/222; F02D 41/2425; F02D 41/2422; G01D 5/2455; G01D 5/244; G01D 5/245; G01D 5/2454; G01D 5/2457; H03M 1/308; H03M 1/22; Y02T 10/40; F02P 7/0675; G01P 3/481
See application file for complete search history.

(56) References Cited

U.S. PATENT DOCUMENTS

| | | | |
|---|---|---|---|
| 5,222,022 A | 6/1993 | Adams et al. | |
| 7,069,774 B2 | 7/2006 | Nakamura et al. | |
| 2004/0089272 A1 | 5/2004 | Kanazawa et al. | |
| 2005/0223787 A1* | 10/2005 | Wang et al. | 73/117.3 |
| 2007/0033995 A1 | 2/2007 | Namari et al. | |
| 2008/0245142 A1* | 10/2008 | Bowling et al. | 73/114.26 |

* cited by examiner

*Primary Examiner* — Manuel L Barbee
(74) *Attorney, Agent, or Firm* — Reinhart Boerner Van Deuren P.C.

(57) ABSTRACT

A flexible crank angle position sensing device and data structure is provided. The device allows a user to enter specific data into a data structure relating to an encoder wheel used to determine the position of the crank shaft. The specific data is stored in the device and can be recalled for use in specific engine implementations. Furthermore, a user can enter data to describe other encoder wheels associated with a cam shaft of an engine. A data structure relating to a cam shaft encoder wheel relates to the data structure relating to the crank shaft encoder wheel such that various positional information, regarding both the cam shaft and crank shaft, can be detected by the device.

23 Claims, 8 Drawing Sheets

FLEXIBLE CRANK ANGLE POSITION SENSING

FIELD OF THE INVENTION

This invention generally relates to determining the angular position of encoder wheels, and more particularly to methods and an apparatus to determine crank angle position.

BACKGROUND OF THE INVENTION

It is desirable for an engine control system to know the crank angle during operation of an engine. Knowing the precise position of the crankshaft during the operation of the engine allows for the control system to determine and/or control a variety of engine parameters needed in order to achieve optimum performance for that engine. For example, one such control parameter is spark plug ignition timing. By timing when the spark plug fires precisely with the position of a piston attached to the crankshaft it is possible to get maximum power from the engine while limiting wear to the cylinder and piston structure.

Typically an apparatus that determines the rotational angle of the crankshaft of an engine includes an encoder wheel, a sensor, and a controller. The encoder wheel is a disc-shaped rotor, which rotates with the crank shaft or the cam shaft. The encoder wheel has a plurality of protruding-teeth or notch structures along the periphery of the rotor. The protruding-teeth or notch structures are not uniformly spaced around the periphery of the disc, and at certain sections one or more teeth may be missing or one or more notches may be enlarged or smaller in order to provide a unique portion of the disc. These non-uniform sections correlate to specific crankshaft rotational angles.

The sensor is configured to detect how many of these protruding-teeth or notches pass by and at what rate, and from the detected information form a pulse train where the non-uniform portions of the pulse train correlate to the sections of missing teeth or elongated or shortened notches, which in turn correlate to a certain crankshaft rotational angle.

Specialized software must be created within the controller prior to operation of the system to interpret the pulse train created from the sensor and encoder wheel. This can be accomplished by creating a table that correlates what the crankshaft rotational angle should be when a non-uniform portion of the pulse train is recognized. Therefore, while the engine is running, the controller makes the comparison between the pulse train from the sensor and the table, and from that information makes a determination of the crankshaft rotational angle.

Furthermore, while the above apparatus is typically found on systems used to determine the rotational angle of the crank shaft, a similar apparatus is used to determine the rotational angle of a cam shaft. Additionally, because the camshaft must be precisely timed to open and close the valves based on the position of the crank shaft, rotational angle information relating to the camshaft also relates to the crankshaft rotational angle. Therefore, the specialized software written to interpret the crankshaft position also must be able to take into account rotational angle position information from the camshaft.

Writing specialized software for any change in encoder wheel, be it for the cam shaft or crank shaft, is a time consuming process that requires many man hours to undertake. Further, various implementations of an engine may utilize different crankshaft and/or camshaft patterns that have different timing requirements. New software must be written to properly control actuators associated with each different camshaft and crankshaft combination. Many times the customer employing the engine will have to go back to the engine supplier to have this specialized software written thereby divulging potential trade secrets to an outside company.

Therefore, it would be advantageous to eliminate the need to create and sometimes recreate the specialized software needed to interpret the various encoder wheel systems. The invention eliminates the need to create specialized software by allowing an end user to create a data representation of an encoder wheel, and then using that data to seed an algorithm that determines the angular position of the encoder wheel. These and other advantages of the invention, as well as additional inventive features, will be apparent from the description of the invention provided herein.

BRIEF SUMMARY OF THE INVENTION

In one aspect, the invention provides a device for determining angular position of an encoder wheel. The device comprises a first sensor for detecting a first pattern from a first encoder wheel. The device also comprises a memory for storing a first encoder wheel pattern data wherein the first encoder wheel pattern data describes the first pattern in data. The device further comprises a control unit that in turn comprises a pattern match block communicatively coupled to the first sensor and compares the first pattern and the first encoder wheel pattern data.

Additionally, in a particular embodiment, the device for determining angular position of an encoder wheel further comprises a second sensor for detecting a second pattern from a second encoder wheel. Wherein the second pattern from the second encoder wheel relates to the first pattern from the first encoder wheel.

In another aspect, the invention provides a method of determining angular position of an encoder wheel. The method comprises selecting a first encoder wheel pattern data, which contains a first encoder wheel data key. The method further comprises sensing a first pattern from a first encoder wheel where the first pattern contains a first encoder key that corresponds to the first encoder wheel data key. The method further comprises comparing the first pattern and the first encoder wheel pattern data, and calculating an angular position of the first encoder wheel when the first encoder wheel data key matches the first encoder key of the first pattern.

Additionally, in another embodiment, the method of determining angular position of an encoder wheel further comprises selecting a second encoder wheel pattern data containing a second encoder wheel data key. Next the method senses a second pattern from a second encoder wheel wherein the second pattern contains a second encoder key that corresponds to the second encoder wheel data key. Finally, the method compares the second pattern and the first encoder wheel pattern data and calculates an angular position of the first encoder wheel when the second encoder wheel data key matches the second encoder key of the second pattern.

In yet another aspect, the invention provides a data structure for defining an encoder wheel system for use in an engine control system associated with an engine. The data structure contains an encoder system definition array defining an encoder wheel system of an engine. The data structure also contains an absolute source encoder wheel definition array defining an absolute source encoder wheel of the engine. Further the data structure contains an absolute source encoder pattern definition array defining an absolute source tooth structure of the absolute source encoder wheel.

In another embodiment of the data structure, a companion source encoder wheel definition array is included. The companion source encoder wheel definition array defines a companion source encoder wheel of the engine. The companion source encoder wheel definition array has an associated companion source encoder pattern definition array that defines a companion source tooth structure of the companion source encoder wheel.

In yet another aspect, the invention provides a data structure for defining an encoder wheel for use in an engine control system. The data structure comprises an encoder definition array, which defines at least one block definition array of an encoder wheel and at least one key definition array of the encoder wheel.

Other aspects, objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Figure 1:
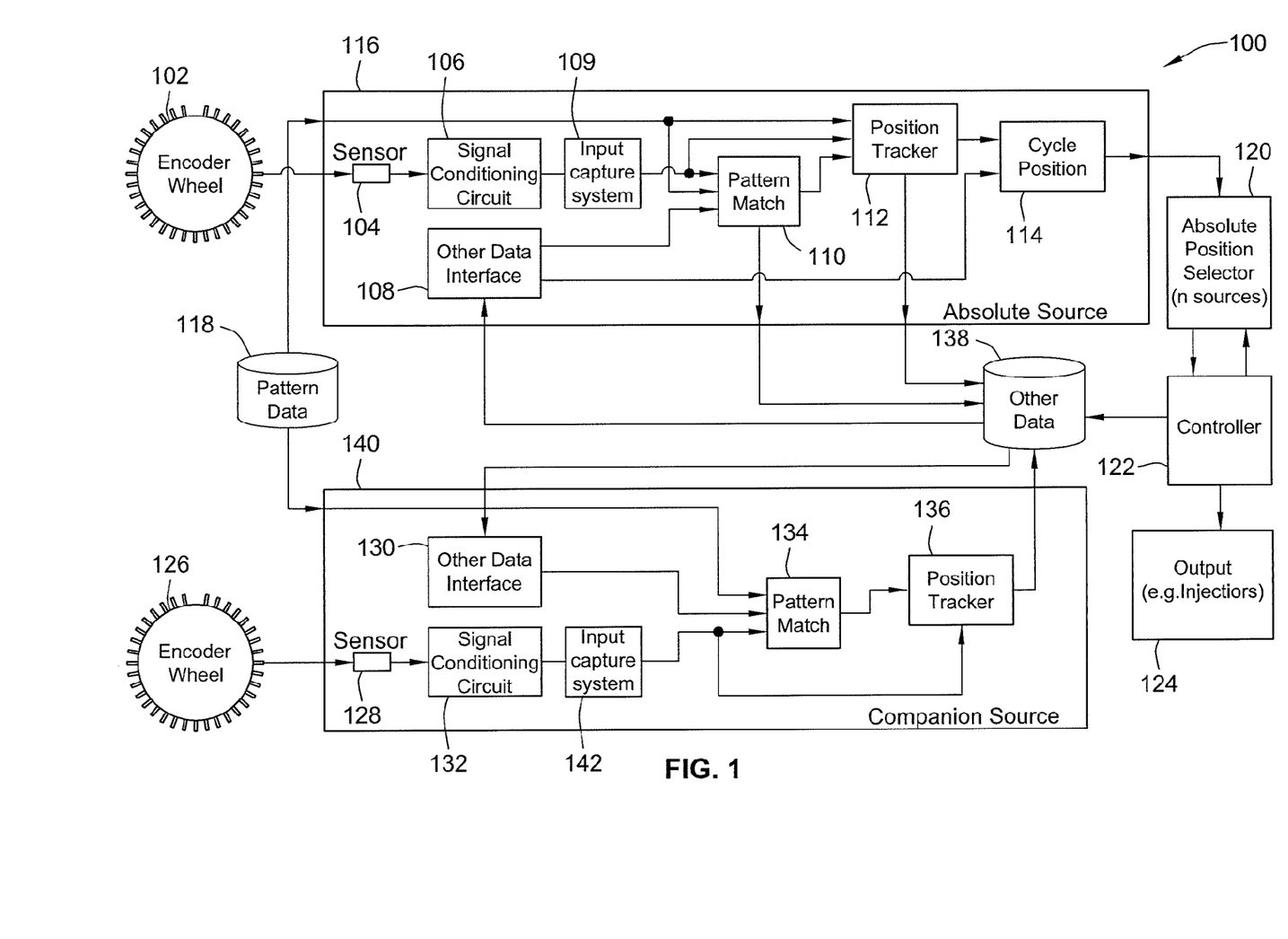
FIG. 1 is flexible encoder system in accordance with a particular embodiment of the present invention.

FIG. 1 shows a particular embodiment of an encoder system 100 with an encoder source in the form of a first and a second encoder wheel 102 and 126 along with a first decoder block absolute source 116 and a second decoder block companion source 140. The encoder system 100 also includes data memory blocks for pattern data 118 and other data 138. The first decoder block 116 outputs into an absolute position selector 120, which in turn is coupled to a controller 122 that controls engine injectors 124. Further, while certain embodiments of the encoder system 100 are described in relation to an engine system including a crankshaft and camshaft, the encoder system 100 can be implemented in any system that uses encoder wheels and requires a determination of the position of those encoder wheels.

Focusing on the first encoder wheel 102 and its respective decoder block 116, a sensor 104 is configured to detect the teeth of the encoder wheel 102 as it spins during engine operation. The sensor output is coupled to a signal conditioning circuit 106 that translates the sensor 104 data into a digital pulse train where at least one edge of each pulse represents angular position around the encoder wheel 102.

The output of the signal conditioning circuit 106 couples to an input capture system 109 that in turn couples to a pattern match block 110 and a position tracker block 112. The pattern match block 110 uses data from the pattern data block 118 to find patterns in the pulse train observed by the signal condition circuit 106 and captured by the input capture system 109. The pattern match block 110 can detect these patterns because they are defined by the user in the pattern data block 118. In this context the user is intended to be a person who implements the system; however, a user is also contemplated as a computer that processes encoder wheel data.

Additionally, the pattern match block 110 and the input capture system 109 are coupled to the position tracker block 112. The position tracker block 112 receives the data from the pattern data block 118 as well. The position tracker block 112 determines the exact position of the encoder wheel 102 by using the data from the pattern data 118 and the pulse train from the signal conditioning circuit 106, as captured by the input capture system 109, along with the pattern information from the pattern match block 110. This is accomplished when the pattern match block 110 gives information that it has detected a pattern in the encoder wheel pulse train that indicates an absolute position, which the position tracker 112 then translates into an absolute position about the encoder wheel 102.

The position tracker 112 then provides the absolute position to the cycle position block 114 and the other data block 138. The cycle position block 114 gives the user the option to have multiple revolutions (e.g. 4-stroke engine has 720 degrees in one cycle, which equates to two revolutions of the encoder wheel 102) of an encoder wheel 102 translated into position. The cycle position block requires pattern match data from the other data block 138 to accomplish this. This data is provided to the cycle position block 114 from the other data interface 108. If the user does not require multiple revolutions for tracking position then the absolute position from the position tracker block 112 is passed through the cycle position block 114.

Regardless of whether the user chooses to implement the cycle position block 114, data regarding the absolute position is passed to the absolute position selector block 120. The controller 122 selects which absolute source it uses to provide system position to the injectors 124. While in the particular embodiment shown in FIG. 1, the encoder system 100 is shown to have only one absolute source and one companion source it is contemplated that more than one absolute source or companion source can be implemented in a single encoder system 100.

Companion source block 140 exists to provide data from a secondary encoder wheel 126 that rotates is relation to the primary encoder wheel 102 of the absolute source block 116. Because companion encoder wheel 126 rotates in relation to the absolute encoder wheel 102, rotational position of the absolute encoder wheel 102 is interpreted from the rotational position of the companion encoder wheel 126.

Companion source block 140 operates similarly to absolute source block 116. Sensor 128 relays raw data to a signal conditioning circuit 132 that in turn couples to an input capture system 142, which develops a digital pulse train. The digital pulse train is provided to a pattern match block 134.

The pattern match block 134 of the companion source block 140 operates slightly differently than the corresponding pattern match block 110 of the absolute source block 116. Pattern match block 134 requires data from both the pattern data block 118 and the other data block 138, which is provided by the other data interface 130. From this information, the pattern match block 134 indicates to the position tracker block 136 when an absolute position mark (distinguishing mark of the encoder wheel) of the companion encoder wheel 126.

Once an absolute position mark is determined that position along with the initial digital pulse train are provided to the position tracker block 136. The position tracker block 136 determines the actual rotational position of the companion encoder wheel 126. The actual rotational position is then provided to the other data block 138.

Therefore, the other data interface 108 is able to provide rotational position information regarding the companion encoder source 126 to the pattern matching block 110 of the absolute source block 116. This enables an additional piece of information used to determine when a particular pattern is found on an absolute encoder wheel 102 in unison with related rotational position of the companion encoder wheel 126. This functionality allows for rotational position of the absolute encoder wheel 102 to be determined based at least in part on the rotational position of the companion encoder wheel 126.

Additionally, while the embodiment of the present invention shown in FIG. 1 shows only single sensors 104 and 128, multiple sensors could be implemented. The primary desire to implement multiple sensors is that redundant sensors allow for the encoder system 100 to continue to work in the event that either sensor 104 or sensor 128 fails. Another reason to implement multiple sensors in the encoder system 100 is for an engine system with multiple cam shafts. Even more broadly, encoder wheel system 100 may be adapted such that any system that may employ multiple encoder wheels that would need multiple sensors is accommodated.

As previously noted, the data that is contained in the pattern data block 118 is entered by the user of the encoder system 100. The data entered by the user describes the encoder wheels 102 and 126 by defining the patterns of teeth that will be detected by the sensors 104 and 128 during engine operation. Therefore, the pattern data 118 acts as a master key for the encoder system 100. Without the data it would not be possible to properly control the engine timing because the pattern data 118 structure provides the information necessary to decode the pulse train measured from the encoder wheels 102 and 126 in order to interpret the angular position of the crankshaft.

Figure 2:
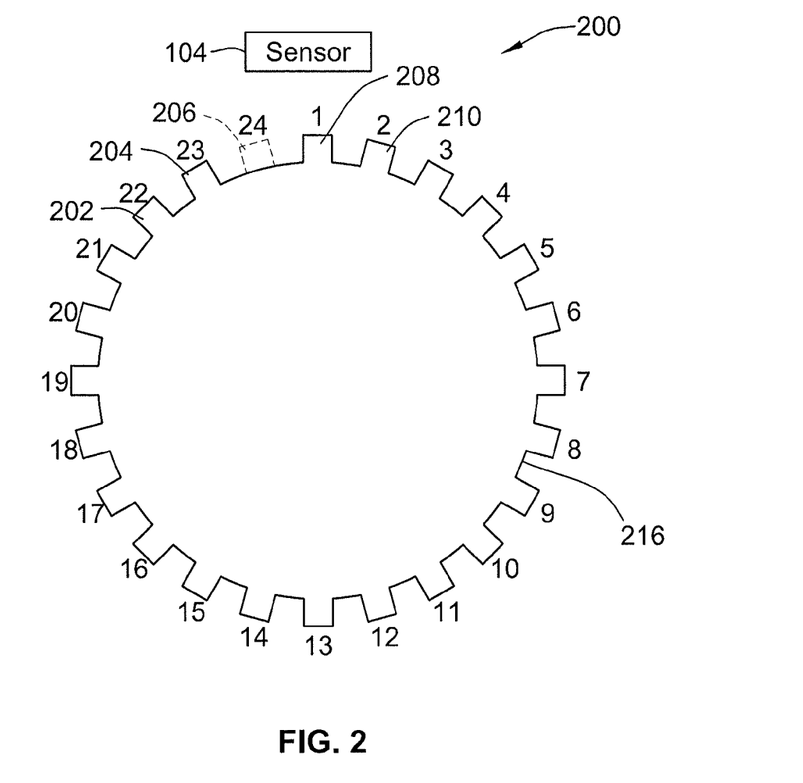
FIG. 2 is 24 minus 1 encoder wheel in accordance with a particular embodiment of the present invention.

Various types of encoder wheels can be implemented in the encoder system 100. Therefore, a flexible data structure, as stored in pattern data block 118, is needed to describe theses various encoder wheels. FIG. 2 shows an encoder wheel 200 in accordance with a particular embodiment of the present invention. The encoder wheel 200 is a 24-minus-1 encoder wheel because it has twenty-four teeth with one tooth removed. The removed tooth happens to be the twenty-fourth tooth 206. The sensor 104 (from FIG. 1) is capable of measuring either the rising or falling edge (or both) and time that each tooth passes by the sensor 104. In order to process the information from the sensor 104, the pattern matching block 110 utilizes input capture system 109. The input capture system has high speed digital inputs that support input capture capability to properly process the measured pulses from the sensor 104 and supply timed data to the pattern matching block 110 that interprets those pulses via a pattern matching process.

The sensor 104 (from FIG. 1), the signal conditioning circuit 106, and the input capture system 109 of the encoder system 100 construct relationships between the edges of the individual teeth of the encoder wheel 216 by observing when the sensor 104 detects a tooth relative to a previously detected tooth. From this time information a ratio is calculated, and a series of ratios is used in the pattern matching process performed by the pattern matching block 110.

For example, the sensor 104 (from FIG. 1) observes a tooth and provides a signal to the signal conditioning circuit 106, which converts the sensor signal into a digital pulse train where at a minimum one edge correlates to an individual encoder wheel 102 tooth. The input capture system 109 receives the digital pulse train as an input and creates a timestamp for every falling edge, rising edge, or both of a tooth. The input capture system 109 then uses the timestamp information to construct ratios based on the following equation: Ratio=ToothPeriod(n)/ToothPeriod(n−1) (1). Where ToothPeriod(n) represents the period of the most recent encoder tooth sensed and ToothPeriod(n−1) represents the period of the previous tooth sensed. While the above equation (1) calculates a ratio based on timestamp information from falling or rising edges, another method contemplated is to calculate the ratio based on a pulse width of individual pulses of the signal from the sensor 106.

Figure 3:
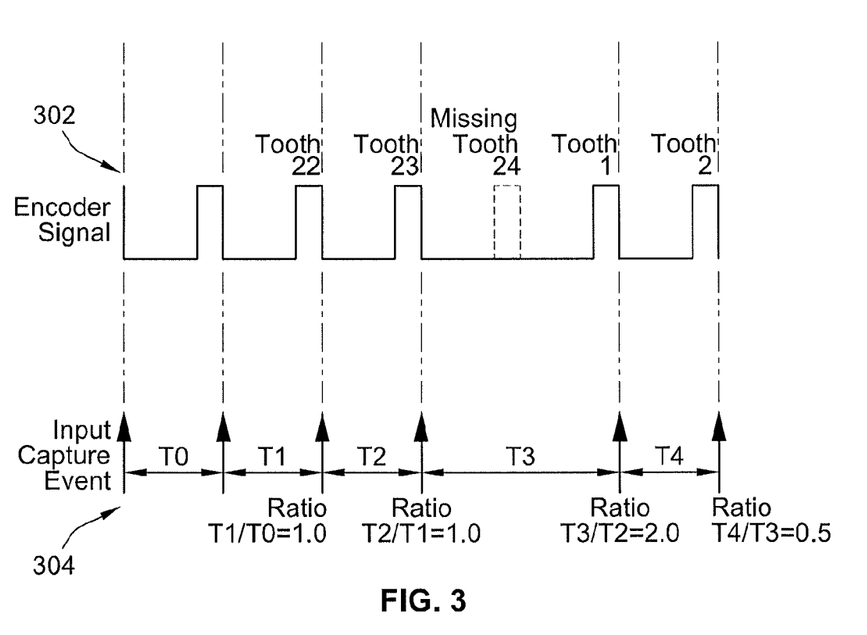
FIG. 3 are pulse trains generated from an encoder wheel in accordance with a particular embodiment of the present invention.

FIG. 3 is an example of a pulse train 302 generated by encoder wheel 216 (from FIG. 2) by using equation (1). The pulse train 302 shows tooth 22 202 through tooth 2 210. Notice that tooth 24 206 is missing. Therefore, as shown in the input capture event signal 304, pulses are captured by the sensor 104 (from FIG. 1) at every falling edge of each tooth of encoder wheel 216. Ratios are then calculated using equation (1), as shown. The ratio is a constant value of 1 until the sensor 104 does not detect a tooth where tooth 24 206 should have been detected. At this point, a ratio of 2 is calculated after the sensor 104 perceives tooth 1 208 because the period for the currently observed event (ToothPeriod(n) from equation 1) is twice as long as the previous period (ToothPeriod(n−1)). Further, the ratio, calculated after tooth 2 210 is perceived by the sensor 104, is 0.5 because the previous period is twice that of the current period.

In another embodiment, the ratios of FIG. 3 are actually a series of impulses that correspond to detected edges of an encoder wheel. As shown in input capture event 304, the series of edge events can form an edge key which is a series of impulses captured at different times. If more than one impulse is present than a series of ratios can be developed from this information, as described above. However, in the event of an encoder wheel with just a single tooth this encoder wheel would utilize an edge key.

Therefore, when the controller sees a ratio of 2 it knows that tooth 1 208 (from FIG. 2) has just been observed, and when the controller sees a ratio of 0.5 it knows that tooth 2 210 has just been observed. This allows the encoder system 100 (from FIG. 1) to synchronize crankshaft position with this perceived sequence of ratios, or in other words this can act as a synchronization event.

Furthermore, this combination of ratios is what is known as a key. A key is a single ratio or a combination of ratios that signify some rotational position information. For instance, in the above example seeing a ratio of 2 was enough to realize that tooth 1 208 had just been perceived, but this could also be perceived by the encoder system 100 (from FIG. 1) as seeing a ratio of 1 followed by a ratio of 2. The same holds true when a ratio of 2 followed by a ratio of 0.5 because that will indicate that tooth 2 210 has just been perceived. In both of these cases, the requirement of adding two sequential ratios makes this key potentially an improved key in the case of system noise that interferes with the timestamp measurements.

As an aside, the previously discussed ratios result from an ideal operating environment and with the engine rotating at a constant speed. In the non-ideal operating environment precise measurement is not possible. Therefore, a tolerance is incorporated into the ratio calculation such that a ratio that is close to the exact value still qualifies as detecting a specific tooth.

Figure 4:
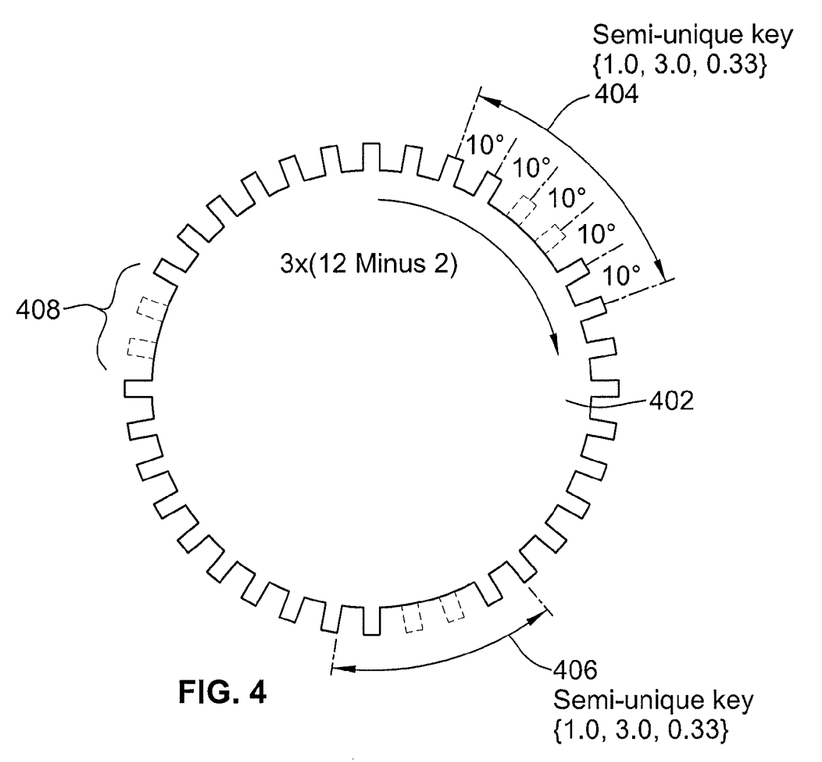
FIG. 4 in an encoder wheel in accordance with a particular embodiment of the present invention.

The combination or single ratios show a standard unique key in that tooth 24 206 is the only missing tooth and therefore a unique position on the encoder wheel 216 (from FIG. 2). Not all keys are designed in such a manner, take the encoder wheel of FIG. 4 as an example. FIG. 4 gives an example of a 3×(12 minus 2) encoder wheel 402. The name of the encoder wheel 402 indicates that the wheel is composed of three groups of twelve teeth, and out of the twelve teeth the last two of the twelve are missing. Therefore, the same key will be noticed three times on a single revolution of the encoder wheel 402, and exact rotational position cannot be precisely determined from detecting an individual key. This type of key structure is called a standard semi-unique key structure because no single key gives a precise rotational position.

The encoder wheel 402 is known as an absolute source because it provides data directly related to the rotational position of the crankshaft. But the semi-unique-key structure of encoder wheel 402 does not allow the encoder system 100 (from FIG. 1) to determine the exact rotational position of the crankshaft alone without additional information. Additional information can come from what is known as a companion source. Typically, in the case of an encoder wheel associated with a crankshaft (absolute source), the companion source will be in the form of an encoder wheel associated with the camshaft.

For example, in a four-stroke engine that utilizes a crankshaft encoder wheel, such as in FIG. 4, rotational position may be determined by using the crankshaft encoder wheel 402 and information from a camshaft encoder wheel, because the two structures have interrelated timing. The most notable use for this relationship is determining what is known as half-cycle information, which is information that indicates that the crankshaft is currently half way through a full cycle of the engine. But the camshaft encoder wheel may fill a number of other roles, such as giving synchronization information for the crankshaft encoder wheel 402, or even act as a redundant crankshaft encoder system in the event of a failure of the actual crankshaft encoder system.

Figure 5:
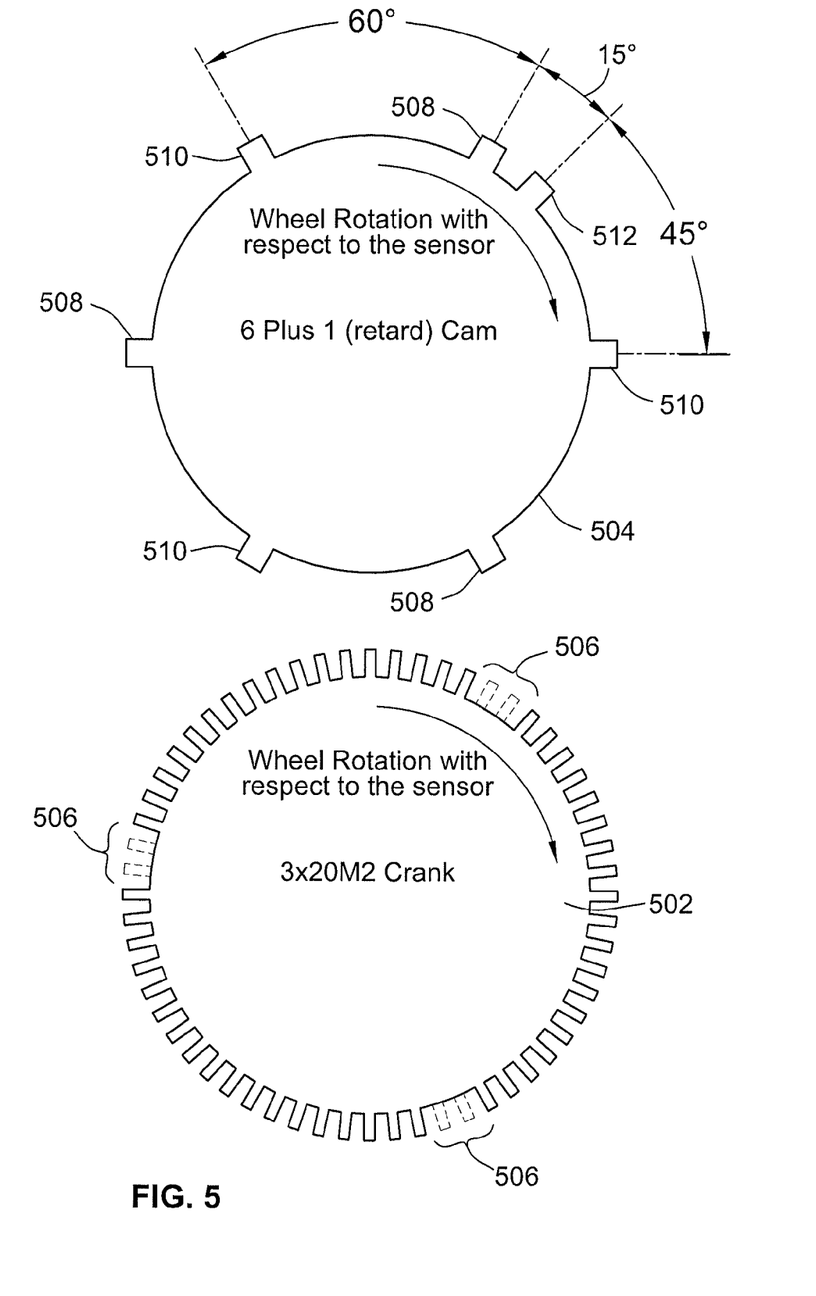
FIG. 5 is a absolute source and a companion source in accordance with a particular embodiment of the present invention.

To illustrate the additional benefits of a companion source consider the encoder wheel shown in FIG. 5, which gives a representative example of a 6 Plus 1 camshaft encoder wheel 504 that has six aligned equidistant encoder teeth plus one extra tooth. Also, FIG. 5 shows a 3×(20 minus 2) crankshaft encoder wheel 502. The crankshaft encoder wheel 502 only has semi-unique keys because the missing teeth portions 506 are evenly dispersed around the circumference of the wheel. Therefore, data from a companion source is needed to synchronize the crankshaft encoder wheel 502 and thereby determine absolute rotational position. In this case, the companion source is the camshaft encoder wheel 504. Notice that teeth 508 align with the missing teeth 506, and that teeth 510 are opposite the missing teeth 506. In the particular embodiment illustrated in FIG. 5, the camshaft encoder wheel 504 is aligned with the crankshaft encoder wheel 502 such that when a tooth 508 is detected it correlates exactly with a set of missing teeth 506. However, it is not necessary that this alignment be preserved as long as tooth 512 correlates to the same missing teeth portion 506. This feature allows this particular embodiment to function in variable cam systems where the phase of the camshaft changes relative to the crankshaft. Further, half-cycle information is acquired from the camshaft encoder wheel 504. In the particular embodiment of the invention shown in FIG. 5, tooth 512 could represent the zero tooth. The encoder system 100 (from FIG. 1) will be able to detect this because tooth 512 represents a standard-unique key. Therefore by detecting tooth 512 the encoder system 100 knows that the camshaft is in the first half cycle of engine operation. Because the tooth structure the encoder system 100 will be able to detect the second half cycle of engine operation by looking at the third tooth from tooth 512.

Additionally, the camshaft encoder wheel 504 can act as a redundant encoder source for the crankshaft encoder wheel 502, should the crankshaft encoder wheel 502 or the sensor 104 (from FIG. 1) fail. Because of the precise placement of the teeth of the camshaft encoder wheel 504 and a known phase relationship between the crankshaft and the camshaft, rotational position information regarding the crankshaft can be determined by the camshaft encoder wheel 504 in the absence of the crankshaft encoder wheel 502. This may occur when the encoder system 100 (from FIG. 1) notices that either the sensor 104 is not detecting any teeth of the crankshaft encoder wheel 502 yet sensor 128 is seeing teeth from the camshaft encoder wheel 504, or when the crank sensor 104 detects that a particular key is not detected on the crankshaft encoder wheel 502 multiple times in a row.

Furthermore, the data structure, stored in the pattern data block 118 (from FIG. 1), is not only capable of storing data pertaining to the rotational position of specific user defined encoder wheels but also contains data that allows the encoder system 100 to recognize system failures. One such system failure is a synchronization error.

A synchronization failure results when the tracked position of an encoder wheel does not match the calculated position of the encoder wheel. Tracked position is updated each time a source tooth is observed. Calculated position is updated each time a unique key is observed. This error is detected when the tracked position and the calculated position do not match, and the source has previously achieved synchronization. The tracked position is not valid until the first calculated position has been observed and so synchronization faults are not possible until the first key match has occurred.

Figure 6:
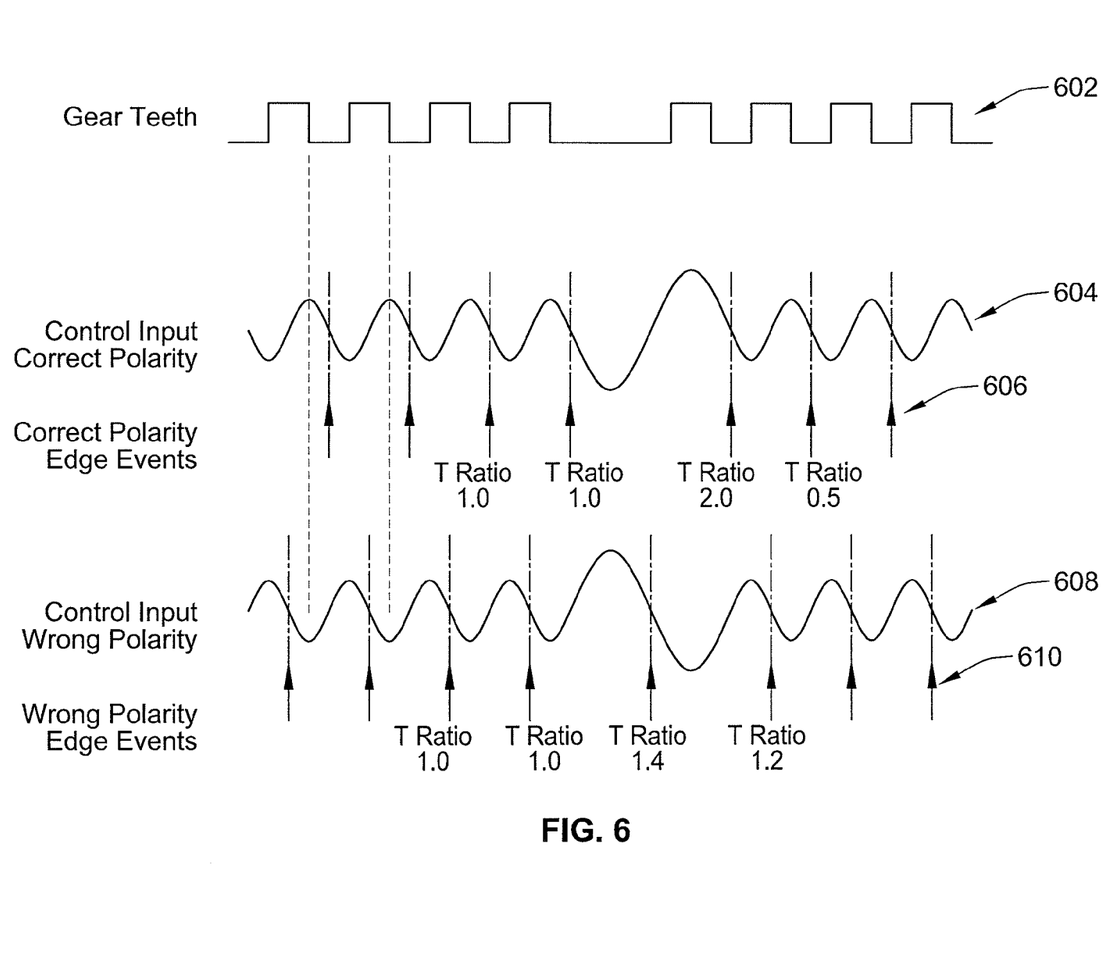
FIG. 6 is an example of signal inversion fault waveforms in accordance with a particular embodiment of the present invention.

Another system failure that is detected through the data structure is a signal inversion fault. In one embodiment of the present invention, sensors 104 and 128 are variable reluctance style sensors, which can be connected incorrectly in a system such that an inverted control signal will be generated, as illustrated in FIG. 6. Waveform 602 shows the digital pulse train derived from the signal conditioning circuit 106 (from FIG. 1). If the sensor 104 is properly installed then the waveform 604 shows the proper polarity that will result in the determining proper ratios such that the key will be recognized by the pattern match block 110. Waveform 608 shows a situation where the sensor 104 is not properly installed and improper ratios are calculated based on the incorrect sensor 104 measurements.

The encoder system 100 can detect that a signal inversion fault has occurred. To detect these faults a user can input a data structure into the pattern data block 118 such that when that particular digital pulse train is encountered in the system the controller 122 will be able to flag the user that a signal inversion fault has occurred.

Another system failure is the half-cycle fault. A half-cycle fault is observed when the tracked position does not match the calculated position, but a synchronization fault has not been observed. This fault implies that a companion source has failed because the half-cycle is determined through companion source data.

Another system failure is the loss fault. A loss fault occurs when sufficient teeth have been observed on a sensor for a companion source without having observed any teeth on the sensor for the absolute source.

Another system failure is the phase error. A phase error occurs when one source (either absolute or companion) is out of phase with another source (either absolute or companion). A phase error is detected when a specific tooth on an encoder wheel does not fall within a window of teeth of the reference encoder wheel (either absolute or companion).

Another system failure is reverse rotation. Reverse rotation occurs when the encoder wheel is rotating in reverse. This error is detected when the encoder system 100 (from FIG. 1) detects that the series of ratios that compose a key as seen backwards.

Figure 7:
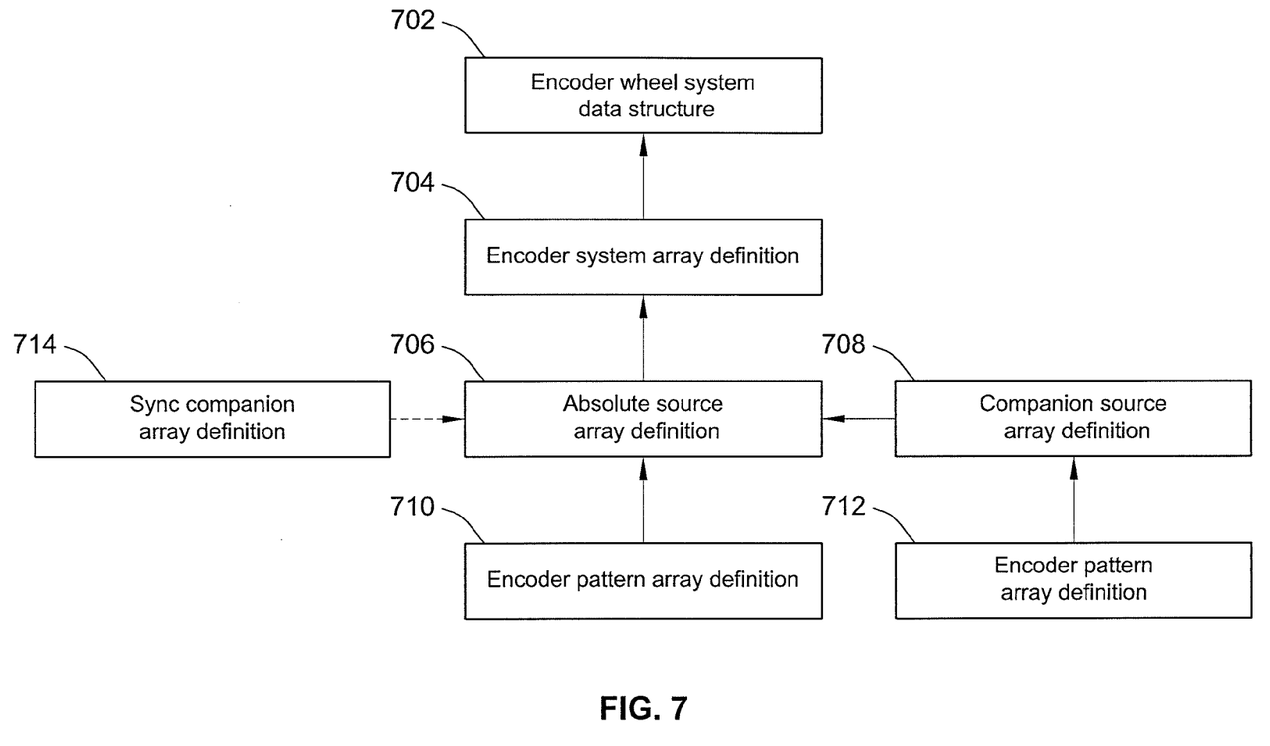
FIG. 7 illustrates an exemplary embodiment of the constituent components of an encoder wheel system data structure in accordance with a particular embodiment of the present invention.

As mentioned previously, the pattern data array 118 (from FIG. 1) stores user defined parameter data regarding the type of encoder wheel implementations supported by the encoder system 100. Several parameter fields would be populated with information to properly describe the physical embodiment of the encoder wheel in data. FIG. 7 illustrates an exemplary embodiment of the data structure of the invention. Specifically, FIG. 7 illustrates the constituent components that allow a user to fully define an encoder wheel system 702 in data. Several array definitions of parameter data are contemplated, such as an encoder system array definition 704 and an absolute source array definition 706. Optionally, one or more companion source array definitions 708 can be defined for various encoder system 100 implementations as well.

As an aside, the term "array" as used herein describes an ordering and organization or hierarchy of data, and not strictly limited to a more traditional mathematical definition.

Further, some encoder wheel system 702 implementations may require a sync companion array definition 714. The sync companion 714 is required in systems that implement two encoder wheels associated with the crankshaft such that one of the encoder wheels provides information that allows the encoder system 100 (from FIG. 1) to sync the two encoder wheels. The encoder wheel that allows the encoder system 100 to sync the other encoder wheel is considered the sync companion. As an example, a first encoder wheel with teeth spaced equidistant from each other and a second encoder wheel with only a single tooth can be used in conjunction such that the system can monitor encoder wheel rotation position for the first encoder wheel and sync the positional measurement with the second encoder wheel when the single tooth is observed. In this example, the second encoder wheel is considered the sync companion. Not all encoder wheel system implementations will require a sync companion 714. Therefore, this specific field is not always present in the encoder wheel system data structure. 702.

Additionally, a user can define one or more companion source array definitions 708. While FIG. 7 shows only a single companion source array definition 708, other embodiments of the invention could utilize more than a single companion source array definition 708, such as an encoder system 100 (from FIG. 1) associated with a V8 engine with dual overhead camshafts. Furthermore, depending on the engine, the encoder system 100 (from FIG. 1) may not have a need for a companion source. Therefore, even though this is not illustrated in FIG. 7, other embodiments of the invention may not include the companion source array definition 708 as part of the encoder wheel system 702.

The various definitions required to fully describe an encoder system in data interrelate with one another. For instance, the encoder system definition 704 describes the overall system by defining information such as the number of degrees of rotation in a full engine cycle, or the number of cylinders this particular application needs to track. Additionally, the encoder system definition 704 references all of the absolute source definitions 706 contained in the pattern data array 118 (from FIG. 1). The encoder system indicates one of the absolute source definitions 706 as active (please note that for simplicity sake, the illustration in FIG. 7 only shows one box for both the absolute source array definitions 706 and the companion source array definitions 708). The active source is the source that is used to determine the system's crank angle position. Therefore, the active source could be an encoder wheel associated with the crankshaft or the camshaft. The active absolute source definition 706 in turn may reference at least one companion source definition 708 if the user has chosen to define a companion source. This way the encoder system knows what source is in use in this particular system.

Furthermore, each absolute source and companion source definition 706, 708 references a user defined encoder pattern definition 710, 712 associated with the particular source referenced in the absolute source or companion source definition 706, 708. The various user defined encoder pattern definitions 710, 712 can be mixed and matched among various absolute source or companion source definitions 706, 708. The absolute source definition 706 can reference various companion source definitions 708, and the encoder system definition 704 can reference various absolute source definitions 706. This way a library of definition data can be stored by the user and recalled for various engine system 100 (from FIG. 1) implementations.

Therefore, an array definition hierarchy exists. The hierarchy is such that the overall system is broadly defined in the encoder system definition 704, which in turn references all absolute source definitions 706 with an active absolute source chosen by the user. The active absolute source definition 706 may or may not, depending on the encoder wheel system 702, also reference a companion source definition 708, as defined by the user. Additionally, when entering the data defining the absolute or companion source definitions 706, 708, the user is able to associate an encoder pattern definition 710, 712 with that specific absolute source definition 706 or companion source definition 708. By creating the above mentioned array definition structure 702, the user is able to provide the encoder system 100 (from FIG. 1) with all the data necessary to determine the position of the crank shaft and/or the cam shaft.

Several parameter fields are desired to implement an encoder system definition. One such parameter field is a "Crank Angle in One Cycle" parameter field. This field allows the user to define the number of degrees of a full engine cycle. Typically, this value will be either 360° or 720°.

Another such field is the "Crank Position Source" parameter field. This field allows a user to provide the name of an absolute source definition (discussed below) that the encoder system definition will reference. Several absolute source definitions may be defined and recalled for later use by entering the name of the absolute source definition in this parameter field.

A "Zero Speed Timeout" is another parameter field used to define an encoder system definition. This parameter field defines a length of time the encoder system will wait without seeing encoder data from the sensor before determining that a zero speed condition has occurred.

Another parameter field is the "Time Delay from 1st Encoder Edge Before Attempting Sync" field. This parameter field allows the user to define an amount of time to wait after a first encoder wheel edge has been detected by allowing synchronization activities to be initiated. This allows system and environment noise that occurs during system initiation to be discarded.

"TDC Angles in Crank Angle Degrees after TDC #1" is another parameter field. This field defines the TDC angles that will be used by some crank synchronous encoder definitions.

The encoder system definition also includes a parameter field called "Number of Cylinders." This parameter field defines how many cylinders the engine system uses.

As mentioned previously, the encoder system definition has a parameter field that a user can enter the name of an absolute source definition to be used by the encoder system definition. The absolute source definition also contains several parameter fields used to define the operation of the user defined absolute source.

One such parameter field of the absolute source definition is the "name" parameter field. This field allows the user to define a name for this absolute source definition such that the encoder system definition can reference this name in order to use this definition for the encoder system operation.

Another parameter field of the absolute source definition is the "Reference Encoder Pattern Definition." This parameter field allows the user to associate a user defined encoder pattern definition (discussed below). The user can enter a given name of a predefined encoder pattern definition that the absolute source definition will reference during encoder system 100 (from FIG. 1) operation.

Another parameter field is the "Source Revolutions Per Cycle." This parameter field allows the user to define how many times the encoder source will revolve in a single engine cycle. A crankshaft encoder wheel used in a four-stroke engine will revolve twice every cycle, and a camshaft encoder wheel will revolve once every cycle for that same four-stroke engine.

Another parameter field is the "Sync Polarity." This field allows a user to define whether the falling edge or the rising edge of the encoder wheel signal from the sensor represents the time at which the crank angle position should be determined.

Another parameter field of the absolute source definition is the "Good Keys to Clear Fault." This parameter field dictates how many keys the encoder system needs to observe without additional fault before it clears an initially detected encoder system fault.

Another parameter field is the "Key Event Aligns With Companion Source." This field allows the user to signify that a key of an absolute source aligns with specific teeth of a companion encoder wheel. This allows events from the companion source to be delayed so as to avoid "race" conditions where two related events are close together. By delaying one, the order of the events can be guaranteed.

Another parameter field is the "Has Loss Companion." This field allows a user to indicate that this particular active absolute source definition has a companion source that is can use to detect loss.

If the "Has Loss Companion" parameter field indicates that the absolute source definition has a companion source, then the "Name of Loss Companion" parameter field is required. This parameter field allows the user to give the name that indicates another previously created absolute source definition or companion source definition that will be used as the companion source in the absolute source definition.

Another parameter field is the "Teeth Before Loss." This parameter field defines a number of companion source encoder wheel teeth of the encoder wheel source defined in the "Name of Loss Companion" parameter field that must be detected without seeing teeth from the absolute source encoder wheel before a fault is determined.

Another parameter field is the "Validate Phase Against Loss Companion." This parameter field allows a user to indicate that the particular absolute source being defined should have its phase checked periodically to detect a possible phase error between an absolute source and a companion source.

Another parameter field is the "Has Sync Companion." This parameter field allows a user to indicate that the absolute source being defined has a sync companion source. If the user indicates that this absolute source definition has a sync companion, then several other parameter field entries are needed.

First, the user must provide a "Name of Sync Companion." This parameter field allows the user to reference the name of a previously defined companion source definition that will be used as the sync companion. Next a parameter field named "Sync Window Teeth" should be provided by the user. This parameter field defines the maximum number of source teeth that should be seen on this absolute source prior to a key being seen on the companion source. This parameter field defines the window where the synchronization event is expected.

Another field related to the sync companion is the "Allow TDC Sync on Loss of Sync Companion." This parameter field allows the first semi-unique key observed on the absolute source, after the sync companion has been detected a fault, to be considered unique. This allows a semi-unique key to provide a synchronization event in the event that the sync companion has suffered a loss fault.

Several other parameter fields exist that are not related to a sync companion. For instance, the parameter field "Has Half-cycle Companion." This parameter field signifies that this absolute source definition has a companion source that is used to determine half-cycle information. If this parameter field is showing that a half-cycle companion source is present then several other related parameter fields are used to determine operation of the half-cycle companion source. One such parameter field is the "Name of Half-cycle Companion." This parameter field merely allows the user to give the name of the predefined companion source that is used as the half-cycle source.

Another parameter field related to the half-cycle source is the "Half-cycle Window Teeth." This parameter field defines the maximum number of teeth that if observed, on the absolute source, imply that the half-cycle companion state can be reliably guessed.

Finally, the absolute source definition has parameter fields that define when the engine's RPM will be observed. The various RPM measurements are saved such that both average and instantaneous RPM can be calculated.

As mentioned previously, the absolute source definition has a parameter field that a user can enter the name of a companion source definition to be used by the absolute source definition. The companion source definition also contains several parameter fields used to define the operation of the user defined companion source.

One such parameter field is the "Reference Encoder Pattern Array." This parameter field associates this companion source with a flexible encoder pattern definition (discussed below). The flexible encoder pattern definition allows the user to define the key patterns of the encoder wheel, among other attributes.

Another parameter field of the companion source definition is the "Source Revolutions Per Cycle." This parameter field defines how many times this companion source will revolve during a single cycle of the engine.

Another parameter field is the "Sync Polarity." This field allows a user to define whether the falling edge or the rising edge of the encoder wheel signal from the sensor represents the time at which the crank angle position should be determined.

Another parameter field of the companion source definition is the "Good Keys to Clear Fault." This parameter field dictates how many keys the encoder system needs to observe without additional fault before it clears an initially detected encoder system fault.

Another parameter field of the companion source definition is the "Key Event Aligns With Companion Source." This parameter field allows the user to signify that a key event of this companion source aligns with certain teeth of an associated absolute source.

Another parameter field of the companion source definition is the "Name of Loss Companion." This parameter field allows the user to provide a name of a different absolute or companion source definition that will act as a companion source to this companion source. A companion source will always have a loss companion because a companion source will never exist in a design without at least one absolute source. The encoder system 100 (from FIG. 1) will determine that a encoder wheel system failure has occurred if this source detects a certain number of teeth on the reference source without detecting teeth on this defined reference source.

Another parameter field of the companion source definition is the "Teeth Before Loss." This parameter field defines the number of teeth detected by the encoder wheel defined in the "Name of Loss Companion" parameter field without detecting teeth of the encoder wheel defined in this companion source definition before a fault is determined.

Finally, the companion source definition has a parameter field called "Validate Phase Against Loss Companion." This parameter field allows the user to indicate whether the phase of this source should be checked periodically. The phase is referenced against the loss companion referenced in the "Name of Loss Companion" parameter field.

The final component of the array definition hierarchy is the flexible encoder pattern definition that both the absolute source definition and the companion source definition reference. The primary purpose of this array definition is to allow the user flexibility to tailor various nuances of any encoder wheel used in the encoder system 100 (from FIG. 1).

When creating a flexible encoder source definition, the user needs to create a name for the particular definition such that the absolute source definition and the companion source definition can reference this particular flexible encoder source definition.

Additionally, the flexible encoder source definition requires precisely defining the structure of the physical teeth of the encoder wheel. To accomplish this each tooth is named and given a LogicalDeg node value. The name is, by convention, a number that starts at zero and increments with each additional tooth. The LogicalDeg defines the angle about the encoder wheel relative to the zero tooth. Therefore, when the user provides a name and LogicalDeg each tooth will have a name and location relative to the zero tooth.

The flexible encoder pattern definition also requires that key information be provided. As discussed previously, keys are a ratio or series of ratio that when detected by the encoder system 100 (from FIG. 1) provide the rotational position of the encoder wheel. A key is of the toothperiod type or the pulsewidth type. The toothperiod type constructs the ratio from adjacent tooth periods. Whereas the pulsewidth type constructs the ratio from the tooth period and the tooth width.

The key itself is constructed by a series of keyvalues. Each keyvalue has a tooth and a ratio node. Therefore, each tooth that has a keyvalue has either a toothperiod or pulsewidth ratio and it is referenced by the previously given numerical name of that particular tooth. This key definition structure is the same for both the absolute source definition and the companion source definition, and applies for all keys including whether the key is standard unique, standard semi unique, reverse rotation, or signal inverted.

Another attribute of the flexible encoder pattern definition is the TeethBeforeAbsentKeyFault. This attribute allows a user to define how many encoder teeth can be detected without detecting a standard key before a fault is issued. Therefore, before the encoder system 100 (from FIG. 1) detects a standard key it begins counting the number of subsequent teeth it detects. If the number of detected keys is greater than the TeethBeforeAbsentKeyFault then a fault will be issued for an encoder wheel failure.

Theoretically, a ratio match is an exact match. However, engine speed is not constant. Engine speed increases and decreases as part of normal operation and also varies instantaneously throughout each engine revolution even when the average speed is constant. Consequently a tolerance needs to be provided for each key to compensate for the variation in the ratio calculation that a varying engine speed will introduce. This attribute of the flexible encoder pattern definition is called the DefaultKeyTolerance. This allows the user to define a small measurement tolerance to make it easier for the system to detect a particular key. Essentially, the DefaultKeyTolerance defines a value that is added to the ideal ratio to define an upper bound and subtracted from the ideal ratio to define a lower bound. This creates a window that the encoder system will allow a particular ratio to fit in and still be classified as a particular tooth ratio measurement. Further, the DefaultKeyTolerance, if not changed by the user, is set to a default value. The user is then able to alter this default value prior to system operation or even during system operation to allow a wider tolerance during certain situations. Certain situation where the user may want to alter tolerance would be during cranking where larger crankshaft accelerations are expected and then reduce the tolerance once the engine is running and the accelerations are less extreme.

The flexible encoder pattern definition also includes information pertaining to half-cycle attributes. When an encoder source is being used for half-cycle information this attribute should be entered into the definition. Three specific types of half-cycle encoding are possible. Those three types are key state, key pin, and key window.

The key state type is used when the flexible encoder pattern definition uses standard unique keys. This is because a standard unique key is able to provide encoder rotational position itself without assistance from a companion source.

The key pin type is used to define the state of the sensor that represents the half-cycle position. An example of an encoder wheel that would use this attribute is a halfmoon encoder wheel. The halfmoon encoder wheel has a single tooth that takes up half the encoder wheel such that the sensor will indicate a tooth for half a cycle. An encoder system that utilizes this halfmoon encoder wheel would access the key pin type to determine whether the half of the cycle that the sensor detects the tooth of the half of a cycle where the sensor does not detect the tooth is the half-cycle position.

The key window type is used when the flexible encoder pattern definition does not provide for an exact half-cycle determination. This particular type of half-cycle attribute determines half-cycle information by detecting a key, and if the key fell within the window defined in key window type, then the engine is currently in a specific half-cycle. If the key is detected outside of the defined window, then the encoder system determines that the engine is in the other half-cycle.

Figure 8:
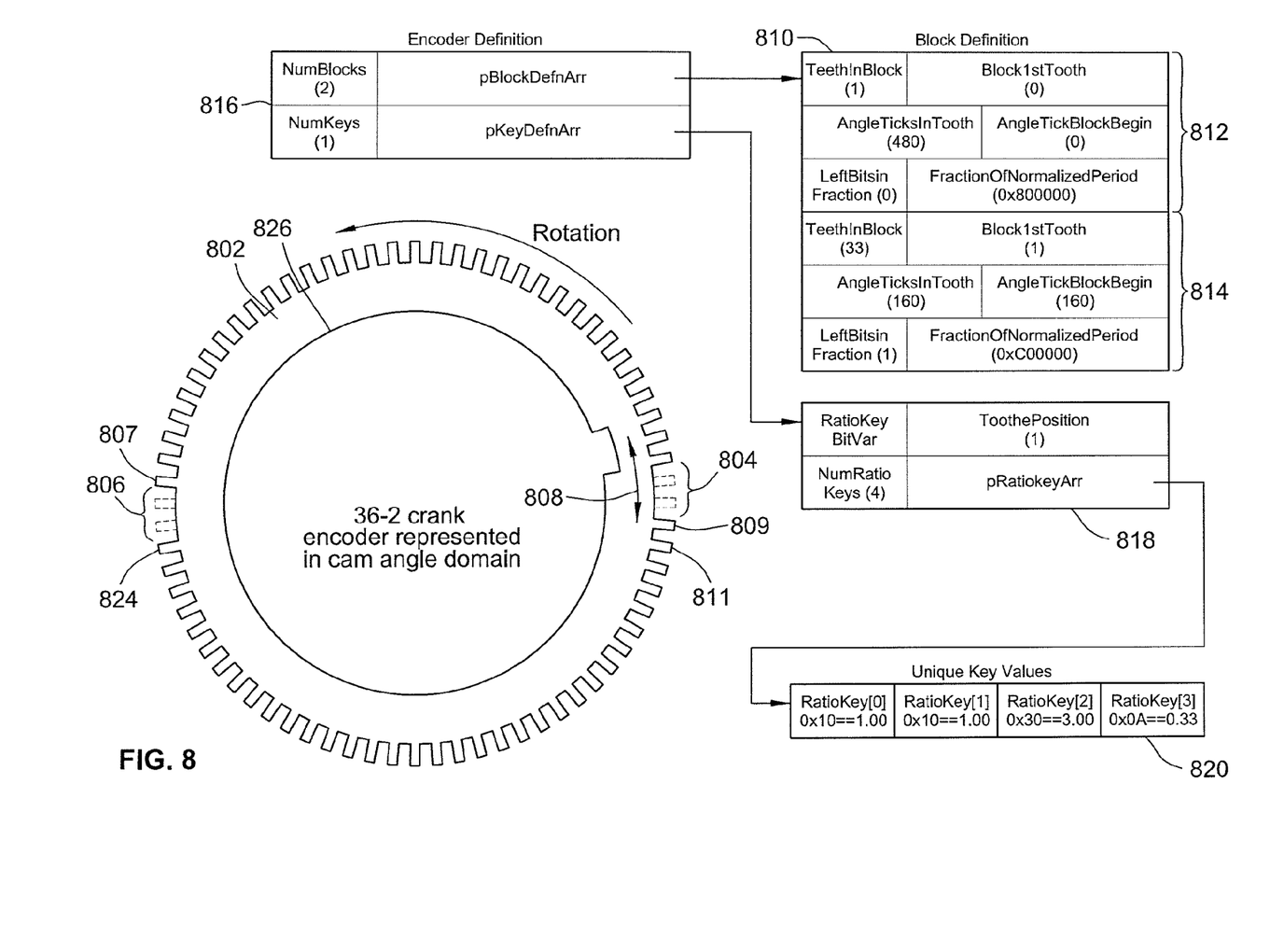
FIG. 8 is a data structure in accordance with a particular embodiment of the present invention.

FIG. 8 shows a particular embodiment of a data structure 800 describing an encoder wheel 802. Some of the above described parameter field entries are contained in this particular embodiment of the data structure, while other are not. Therefore, depending on the specific encoder wheel application the corresponding data structure will change to include more or less fields than are represented in FIG. 8.

Encoder wheel 802 is a 36-2 crank encoder wheel represented in the cam angle domain because two blocks of thirty-six teeth exist, each with the last two teeth 804, 806 missing and aligned with a single tooth cam encoder wheel 816. A key 808 is shown that encompasses two missing teeth, tooth 0 of the first block of teeth, and 31, 32, and 33 of the second block of teeth.

The data structure 800 is composed of four main blocks that are interrelated and pertain to a main block definition 810, an encoder definition 816, a keys definition 818, and a unique key values array 820.

The main block definition 810 contains two sub-blocks 812, 814, each sub-block 812 and 814 define a group of teeth with the same spacing of encoder wheel 802. Sub-block 812 defines the first tooth 807, 809 that occurs after the missing tooth region 804, 806. Whereas sub-block 814 defines all the other teeth.

The TeethInBlock section is the sum total of teeth in that particular block, in sub-block 812, this is only a single tooth, while in sub-block 814 this is 33 teeth. The TeethInBlock allows large groups of similar adjacent teeth to be described in a relatively small amount of data. This is desirable for implementation in embedded systems that have limited resources.

The Blocks1stTooth section, when combined with the TeethInBlock section, provides a mechanism to detect whether a given tooth is defined by a particular block. For the sub-block 812 this value is a 0 because that is the start of sub-block definition 812. Because the TeethInBlock of sub-block in 1 then the encoder system 100 (from FIG. 1) knows that the block is only one tooth long. For the sub-block 814 this value is a 1 because the first tooth of sub-block 814 is tooth 1 811, and the TeethInBlock entry is 33. Therefore, the encoder system 100 knows that each tooth from 1 to 33 is part of sub-block 814.

The encoder definition array 816 contains fields pBlock-DefnArr and NumBlocks. Numblocks indicates the amount of blocks from the block definition 810 section of the data structure. In FIG. 8 this equals two blocks, as described above. The pBlockDefnArr field points to the information from the block definition 810 section.

The encoder definition array 816 also contains fields NumKeys and pKeyDefnArr. NumKeys contains the number of keys per defined block, which because we defined the block in 36 teeth in FIG. 8 only one key is present. The pKey-DefnArr field points to the keys definition array 818.

The keys definition array 818 describes an array of key definitions that include information like what tooth position a referenced key corresponds to and the number of key ratio key values used by the key definition. In FIG. 8, the referenced key position correspond to tooth one and there are a total of four keys values that make up the key.

Additionally, the keys definition block 818 contains a pointer pRatioKeyArr that points to the unique key values array 820. The unique key value array 820 contains the ratio values for each key calculated using equation (1). For the embodiment shown in FIG. 8, the key ratios are 1, 1, 3, and 0.33. These ratios are the key values that are used to determine a match in the pattern match block from FIG. 1.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A device for determining angular position of an encoder wheel associated with a crankshaft of an internal combustion engine, the device comprising:
    a first encoder wheel having a plurality of teeth;
    a first sensor arranged in proximity to said first encoder wheel for detecting a first pattern from the first encoder wheel;
    a memory for storing a first encoder wheel pattern data wherein the first encoder wheel pattern data describes the first pattern in data;
    a control unit comprising a pattern match block communicatively coupled to the first sensor and compares the first pattern and the first encoder wheel pattern data;
    wherein the first pattern contains at least one encoder key, and the first encoder wheel pattern data defines a data key that corresponds to the encoder key;
    wherein the at least one encoder key comprises at least one ratio, wherein the at least one ratio is a period of time of a most recent encoder tooth of the plurality of teeth of the first encoder wheel sensed by the sensor to a period of time of an encoder tooth of the plurality of teeth sensed by the sensor immediately prior the most recent encoder tooth sensed.

2. The device of claim 1, wherein the control unit further comprises a signal conditioning circuit interposed between the first sensor and the pattern match block; wherein the signal conditioning circuit converts the first pattern into a digital pulse stream.

3. The device of claim 2, wherein the pattern match block compares the first encoder wheel pattern data to the digital pulse stream.

4. The device of claim 1, wherein the control unit further comprises a position tracker block that converts a match between the encoder key and the data key found by the pattern match block into an angular position of the first encoder wheel.

5. The device of claim 1, wherein the first encoder wheel pattern data is selected from a library of predefined encoder wheel data.

6. The device of claim 1, wherein the first encoder wheel pattern data is defined in an encoder wheel data structure.

7. The device of claim 1, further comprising a second sensor for detecting a second pattern from a second encoder wheel, wherein the second pattern from the second encoder wheel relates to the first pattern from the first encoder wheel.

8. The device of claim 7, wherein the memory stores a second encoder wheel pattern data that describes the second pattern in data.

9. The device of claim 8, wherein the first encoder wheel pattern data and the second encoder wheel pattern data is selected from a library of predefined encoder wheel data.

10. The device of claim 8, wherein the first encoder wheel pattern data and the second encoder wheel pattern data are defined in a encoder wheel data structure.

11. The device of claim 7, wherein the second encoder wheel is a camshaft encoder wheel associated with an engine.

12. The device of claim 7, wherein the second encoder wheel is a sync companion of the first encoder wheel.

13. The device of claim 1, wherein the first encoder wheel is a crankshaft encoder wheel associated with an engine.

14. A method of determining angular position of an encoder wheel associated with a crankshaft of an internal combustion engine, the method comprising the steps of:
   selecting a first encoder wheel pattern data;
      wherein the first encoder wheel pattern data contains a first encoder wheel data key;
   sensing a first pattern from a first encoder wheel, the first encoder wheel including a plurality of teeth, using a sensor situated in proximity to the first encoder wheel, the sensor configured to detect at least one of a rising and falling edge of each tooth of the plurality of teeth of the first encoder wheel;
      wherein the first pattern contains a first encoder key that corresponds to the first encoder wheel data key, wherein the first encoder key comprises at least one ratio, wherein the at least one ratio is a period of time of a most recent encoder tooth of the first encoder wheel sensed by the sensor to a period of time of an encoder tooth sensed by the sensor immediately prior the most recent encoder tooth sensed;
   comparing the first pattern and the first encoder wheel pattern data;
   calculating an angular position of the first encoder wheel when the first encoder wheel data key matches the first encoder key of the first pattern.

15. The method of claim 14, wherein the first encoder wheel pattern data is selected from a library of encoder wheel pattern data.

16. The method of claim 14, wherein the first encoder wheel pattern data is defined in an encoder wheel data structure.

17. The method of claim 14, further comprising the steps of selecting a second encoder wheel pattern data containing a second encoder wheel data key;
   sensing a second pattern from a second encoder wheel wherein the second pattern contains a second encoder key that corresponds to the second encoder wheel data key;
   comparing the second pattern and the first encoder wheel pattern data;
   calculating an angular position of the second encoder wheel when the second encoder wheel data key matches the second encoder key of the second pattern.

18. The method of claim 17, wherein the step of calculating the angular position of the first encoder wheel is further based on the angular position of the second encoder wheel.

19. The method of claim 17, wherein the first encoder wheel pattern data and the second encoder wheel pattern data is selected from a library of encoder wheel pattern data.

20. The method of claim 17, wherein the first encoder wheel pattern data and the second encoder wheel pattern data is defined in an encoder wheel data structure.

21. The method of claim 17, wherein the second encoder wheel is a camshaft encoder wheel associated with an engine.

22. The method of claim 17, wherein the second encoder wheel is a sync companion associated with the first encoder wheel.

23. The method of claim 14, wherein the first encoder wheel is a crankshaft encoder wheel associated with an engine.

* * * * *